US010116277B2

(12) United States Patent
Lin et al.

(10) Patent No.: US 10,116,277 B2
(45) Date of Patent: Oct. 30, 2018

(54) RADIO FREQUENCY POWER AMPLIFIER

(71) Applicant: National Chi Nan University, Puli, Nantou (TW)

(72) Inventors: Yo-Sheng Lin, Nantou (TW); Van-Kien Nguyen, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 15/427,937

(22) Filed: Feb. 8, 2017

(65) Prior Publication Data
US 2017/0366149 A1 Dec. 21, 2017

(30) Foreign Application Priority Data

Jun. 17, 2016 (TW) .............................. 105119050 A

(51) Int. Cl.
H03F 3/68 (2006.01)
H03F 3/60 (2006.01)
H03F 1/56 (2006.01)
H03F 3/193 (2006.01)
H03F 3/21 (2006.01)
H03F 1/34 (2006.01)
H03F 3/24 (2006.01)

(52) U.S. Cl.
CPC ............ H03F 3/607 (2013.01); H03F 1/342 (2013.01); H03F 1/56 (2013.01); H03F 3/193 (2013.01); H03F 3/21 (2013.01); H03F 3/245 (2013.01); H03F 3/604 (2013.01); H03F 2200/222 (2013.01); H03F 2200/318 (2013.01); H03F 2200/387 (2013.01); H03F 2200/405 (2013.01); H03F 2200/451 (2013.01); H03F 2200/543 (2013.01)

(58) Field of Classification Search
CPC ..... H03F 1/38; H03F 1/40; H03F 3/68; H03F 3/191; H03F 3/193
USPC ............ 330/98, 99, 100, 103, 104, 302, 306
See application file for complete search history.

(56) References Cited

U.S. PATENT DOCUMENTS 3,461,398 A * 8/1969 Gammel ................. H03F 3/191
330/100
9,479,123 B2 * 10/2016 Darwish ............... H03F 1/3247

* cited by examiner

Primary Examiner — Steven J Mottola
(74) Attorney, Agent, or Firm — Womble Bond Dickinson (US) LLP

(57) ABSTRACT

A radio frequency (RF) power amplifier includes an amplifying stage that includes an amplifying module, an input module and a feedback module. The amplifying module receives an RF to-be-amplified signal, and performs power amplification on the RF to-be-amplified signal to generate an RF output signal. The input module receives an RF input signal. The feedback module receives the RF output signal, cooperates with the input module to provide the RF to-be-amplified signal based on the RF input and output signals, and cooperates with the amplifying module to form a positive feedback loop that provides a loop gain which is less than one.

18 Claims, 11 Drawing Sheets

RADIO FREQUENCY POWER AMPLIFIER

CROSS-REFERENCE TO RELATED APPLICATION

This application claims priority of Taiwanese Patent Application No. 105119050, filed on Jun. 17, 2016.

FIELD

The disclosure relates to an amplifier, and more particularly to a radio frequency power amplifier.

BACKGROUND

A radio frequency (RF) power amplifier that is implemented in III-V (e.g., gallium-arsenide (GaAs)) technologies generally has relatively good power amplification performance and relatively high manufacturing costs. An RF power amplifier that is implemented in complementary metal oxide semiconductor (CMOS) technologies generally has relatively poor power amplification performance and relatively low manufacturing costs.

SUMMARY

Therefore, an object of the disclosure is to provide a radio frequency (RF) power amplifier that has relatively good power amplification performance and relatively low manufacturing costs.

According to the disclosure, the RF power amplifier includes a number (N) of amplifying stages, each receiving a respective RF input signal and outputting a respective RF output signal, where N≥1. When N≥2, the amplifying stages are cascaded, and the respective RF output signal outputted by an $n^{th}$ one of the amplifying stages serves as the respective RF input signal received by an $(n+1)^{th}$ one of the amplifying stages, where $1 \leq n \leq (N-1)$. Each of first to $M^{th}$ ones of the amplifying stages includes an amplifying module, an input module and a feedback module, where $1 \leq M \leq N$. The amplifying module receives an RF to-be-amplified signal, and performs power amplification on the RF to-be-amplified signal to generate the respective RF output signal. The input module is coupled to the amplifying module, and receives the respective RF input signal. The feedback module is coupled to the amplifying module and the input module, and receives the respective RF output signal from the amplifying module. The feedback module cooperates with the input module to provide, based on the respective RF input signal and the respective RF output signal, the RF to-be-amplified signal for the amplifying module. The feedback module cooperates with the amplifying module to form a positive feedback loop that provides a loop gain which is less than one.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
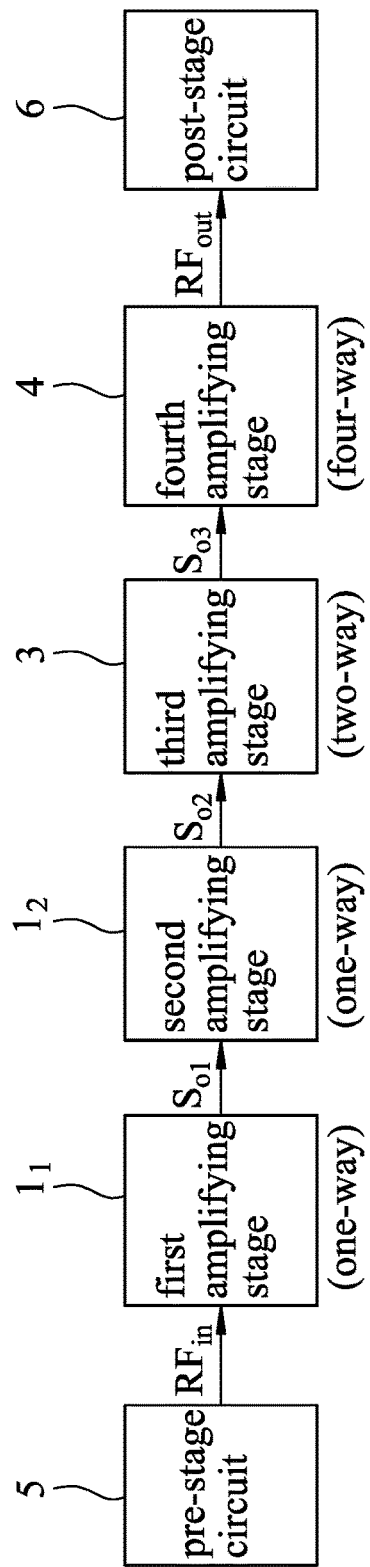
FIG. 1 is a block diagram illustrating a first embodiment of a radio frequency (RF) power amplifier according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a radio frequency (RF) power amplifier according to the disclosure is used to be coupled between a pre-stage circuit 5 and a post-stage circuit 6. For example, the RF power amplifier of this embodiment may be applied in a communication system or a wireless transceiver, in which the pre-stage circuit 5 may be a mixer or another power amplifier, and the post-stage circuit 6 may be an antenna circuit.

The RF power amplifier includes a number (N) of cascaded amplifying stages (in the depicted example, N=4). As depicted, the amplifying stages are respectively a first amplifying stage $1_1$, a second amplifying stage $1_2$, a third amplifying stage 3 and a fourth amplifying stage 4, and each receives a respective RF input signal and outputs a respective RF output signal. The first amplifying stage $1_1$ is used to be coupled to the pre-stage circuit 5 for receiving the respective RF input signal ($RF_{in}$) therefrom. The respective RF output signal (e.g., $S_{o1}$, $S_{o2}$, $S_{o3}$) outputted by the $n^{th}$ amplifying stage (e.g., $1_1$, $1_2$, 3) serves as the respective RF input signal received by the $(n+1)^{th}$ amplifying stage (e.g., $1_2$, 3, 4), where $1 \leq n \leq (N-1)$ (e.g., $1 \leq n \leq 3$). The $N^{th}$ amplifying stage (e.g., the fourth amplifying stage 4) is used to be coupled to the post-stage circuit 6 for outputting the respective RF output signal ($RF_{out}$) thereto.

Figure 2:
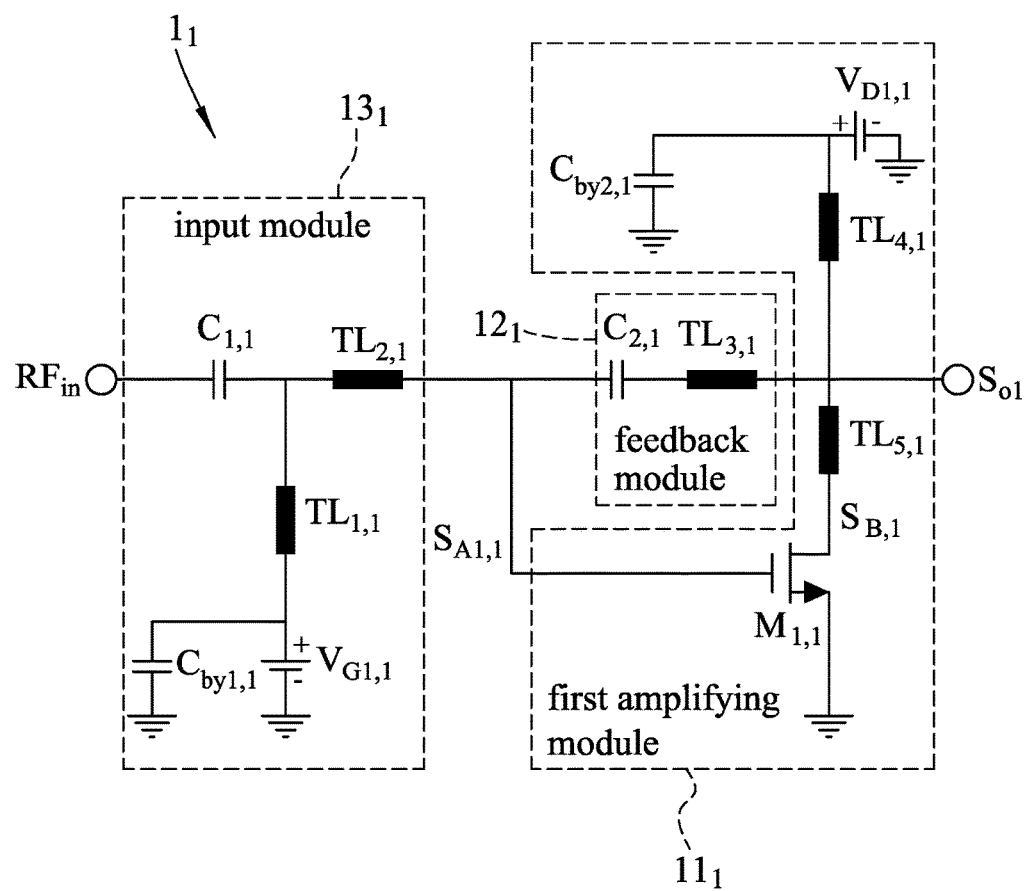
FIG. 2 is a circuit diagram illustrating a first amplifying stage of the first embodiment.
Figure 3:
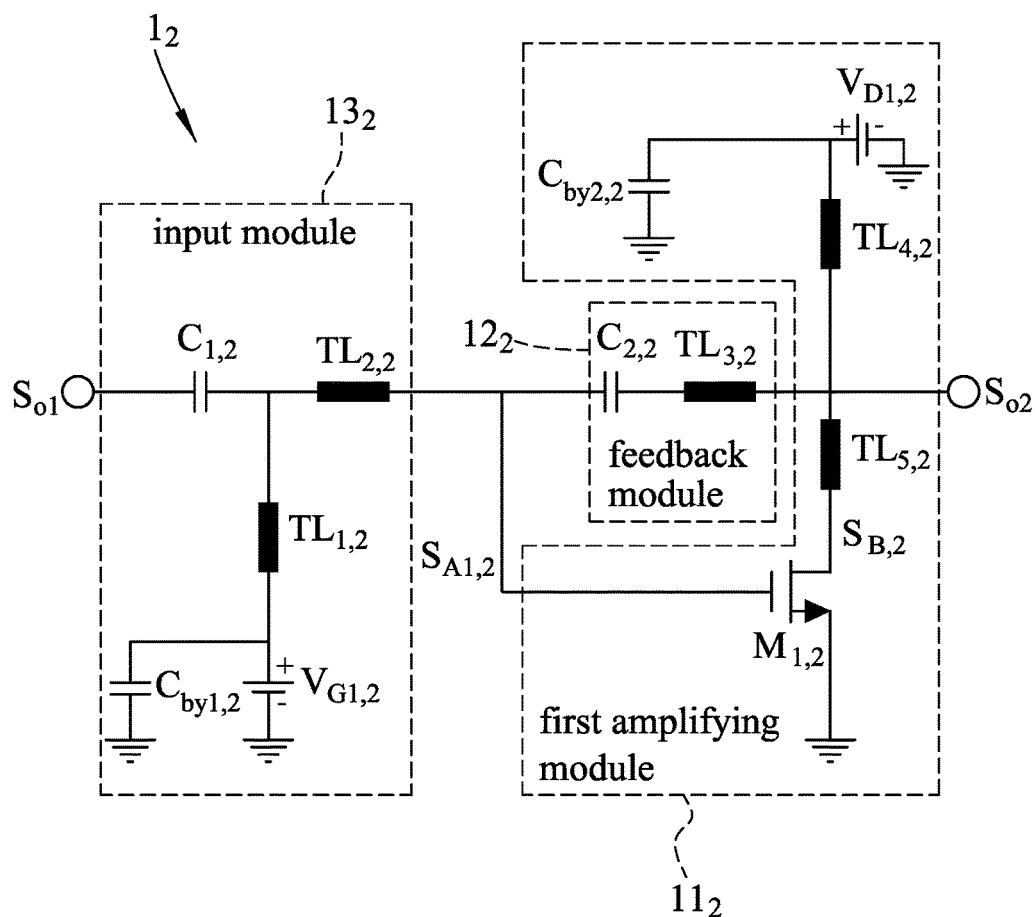
FIG. 3 is a circuit diagram illustrating a second amplifying stage of the first embodiment.

Referring to FIGS. 1 to 3, in the depicted example, each of the first to $M^{th}$ amplifying stages is a one-way amplifying stage, where M=N−2. In the depicted example, M=2, and each of the first to $M^{th}$ (i.e., the second) amplifying stages $1_1$, $1_2$ includes a first amplifying module $11_1$, $11_2$, an input module $13_1$, $13_2$ and a feedback module $12_1$, $12_2$. The first amplifying module $11_1$, $11_2$ receives a first RF to-be-amplified signal ($S_{A1,1}$, $S_{A1,2}$), and performs power amplification on the first RF to-be-amplified signal ($S_{A1,1}$, $S_{A1,2}$) to generate the respective RF output signal ($S_{o1}$, $S_{o2}$). The input module $13_1$, $13_2$ is coupled to a respective one of the pre-stage circuit 5 and the first to $(M-1)^{th}$ amplifying stages (i.e., the first amplifying stage $1_1$) for receiving the respective RF input signal ($RF_{in}$, $S_{o1}$) therefrom, and is coupled further to the first amplifying module $11_1$, $11_2$. The feedback module $12_1$, $12_2$ is coupled to the first amplifying module $11_1$, $11_2$ and the input module $13_1$, $13_2$, and receives the respective RF output signal ($S_{o1}$, $S_{o2}$) from the first amplifying module $11_1$, $11_2$. The feedback module $12_1$, $12_2$ cooperates with the input module $13_1$, $13_2$ to provide, based on the respective RF input signal ($RF_{in}$, $S_{o1}$) and the respective RF output signal ($S_{o1}$, $S_{o2}$), the first RF to-be-amplified signal ($S_{A1,1}$, $S_{A1,2}$) for the first amplifying module $11_1$, $11_2$. The feedback module $12_1$, $12_2$ cooperates with the first amplifying module $11_1$, $11_2$ to form a positive feedback loop that provides a loop gain which is positive and which is less than one.

In the depicted example, for each of the first to $M^{th}$ (i.e., the second) amplifying stages $1_1$, $1_2$, the first amplifying module $11_1$, $11_2$ further performs power amplification on the first RF to-be-amplified signal ($S_{A1,1}$, $S_{A1,2}$) to generate an RF inverted signal ($S_{B,1}$, $S_{B,2}$) that is anti-phase with the first RF to-be-amplified signal ($S_{A1,1}$, $S_{A1,2}$), and a portion of the first RF to-be-amplified signal ($S_{A1,1}$, $S_{A1,2}$) that is contributed by the respective RF output signal ($S_{o1}$, $S_{o2}$) is anti-phase with the RF inverted signal ($S_{B,1}$, $S_{B,2}$). In other words, the first amplifying module $11_1$, $11_2$ and the feedback module $12_1$, $12_2$ cooperatively provide a total phase shift of 360° (i.e., cooperatively forming a positive feedback loop). Moreover, the input module $13_1$, $13_2$ of each of the first to $M^{th}$ (i.e., the second) amplifying stages $1_1$, $1_2$ determines an input impedance seen into the amplifying stage $1_1$, $1_2$; the input module $13_1$ of the first amplifying stage $1_1$ is configured such that the input impedance seen into the first amplifying stage $1_1$ matches an output impedance (e.g., 50Ω) seen into the pre-stage circuit 5; and the input module $13_m$ of the $m^{th}$ amplifying stage $1_m$ is configured such that the input impedance seen into the $m^{th}$ amplifying stage $1_m$ matches an output impedance seen into the $(m-1)^{th}$ amplifying stage $1_{m-1}$, where $2 \leq m \leq M$ (i.e., m=2).

It should be noted that, in the depicted example, the first to $M^{th}$ (i.e., the second) amplifying stages $1_1$, $1_2$ have the same configuration, and therefore only the first amplifying stage $1_1$ is exemplarily described hereinafter for the sake of brevity.

In the depicted example, the first amplifying module $11_1$ includes a transistor ($M_{1,1}$), two inductors ($TL_{4,1}$, $TL_{5,1}$) and a bypass capacitor ($C_{by2,1}$). The transistor ($M_{1,1}$) (e.g., an N-type metal oxide semiconductor field effect transistor (nMOSFET)) has a first terminal (e.g., a drain terminal) that provides the RF inverted signal ($S_{B,1}$), a second terminal (e.g., a source terminal) that is grounded, and a control terminal (e.g., a gate terminal) that receives the first RF to-be-amplified signal ($S_{A1,1}$). The inductor ($TL_{5,1}$) has a first terminal that provides the respective RF output signal ($S_{o1}$), and a second terminal that is coupled to the first terminal of the transistor ($M_{1,1}$). The inductor ($TL_{4,1}$) has a first terminal that is used to receive a direct current (DC) supply voltage ($V_{D1,1}$), and a second terminal that is coupled to the first terminal of the inductor ($TL_{5,1}$). The bypass capacitor ($C_{by2,1}$) is coupled between the first terminal of the inductor ($TL_{4,1}$) and ground, and has a substantially zero impedance when the RF power amplifier operates in a predetermined frequency band, such that the first terminal of the inductor ($TL_{4,1}$) is substantially grounded when the RF power amplifier operates in the predetermined frequency band.

In the depicted example, the input module $13_1$ includes a capacitor ($C_{1,1}$), two inductors ($TL_{1,1}$, $TL_{2,1}$) and a bypass capacitor ($C_{by1,1}$). The capacitor ($C_{1,1}$) has a first terminal that is used to receive the respective RF input signal ($RF_{in}$), and a second terminal. The capacitor ($C_{1,1}$) is used for alternating current (AC) coupling and DC blocking. The inductor ($TL_{2,1}$) is coupled between the second terminal of the capacitor ($C_{1,1}$) and the control terminal of the transistor ($M_{1,1}$). The inductor ($TL_{1,1}$) has a first terminal that is coupled to the second terminal of the capacitor ($C_{1,1}$), and a second terminal that is used to receive a DC supply voltage ($V_{G1,1}$). The bypass capacitor ($C_{by1,1}$) is coupled between the second terminal of the inductor ($TL_{1,1}$) and ground, and has a substantially zero impedance when the RF power amplifier operates in the predetermined frequency band, such that the second terminal of the inductor ($TL_{1,1}$) is substantially grounded when the RF power amplifier operates in the predetermined frequency band.

In the depicted example, the feedback module $12_1$ includes a capacitor ($C_{2,1}$) and an inductor ($TL_{3,1}$). The capacitor ($C_{2,1}$) has a first terminal that is coupled to the control terminal of the transistor ($M_{1,1}$), and a second terminal. The inductor ($TL_{3,1}$) is coupled between the second terminal of the capacitor ($C_{2,1}$) and the first terminal of the inductor ($TL_{5,1}$).

In the depicted example, each inductor ($TL_{1,1}$-$TL_{5,1}$) is a transmission line inductor with a predetermined electrical length, and may be implemented using a microstrip. A sum of the predetermined electrical lengths of the inductors ($TL_{3,1}$, $TL_{5,1}$) equals $\lambda/2$, where $\lambda$ is a wavelength of the respective RF input signal ($RF_{in}$). In an example where the RF power amplifier operates at 94 GHz (i.e., the respective RF input signal ($RF_{in}$) has a frequency of 94 GHz), $\lambda/2 = \lfloor (3 \times 10^{14})/(2 \times 94 \times 10^9 \times \sqrt{3.4379}) \rfloor$ μm=861 μm.

In the depicted example, an open-loop gain ($G_{o1}$) provided by the first amplifying module $11_1$ can be expressed by the following equation:

$$G_{o1} = \left.\frac{V_{SB,1}}{V_{SA1,1}}\right|_{open} = -g_{m1} \cdot \left\{[(Z_{out} // sL_4 // sL'_3) + sL_5] // \frac{1}{sC_{ds1}} // R_{ds1}\right\}, \quad \text{Equation 1}$$

where $V_{SB,1}$ denotes a voltage amplitude of the RF inverted signal ($S_{B,1}$), $V_{SA1,1}$ denotes a voltage amplitude of the first RF to-be-amplified signal ($S_{A1,1}$), $g_{m1}$ denotes a transconductance of the transistor ($M_{1,1}$), $Z_{out}$ denotes the input impedance seen into the second amplifying stage $1_2$, $L_4$ denotes an inductance of the inductor ($TL_{4,1}$), $L_3' = L_3/(1 - V_{So1}/V_{SA1,1})$, $L_3$ denotes an inductance of the inductor ($TL_{3,1}$), $V_{So1}$ denotes a voltage amplitude of the respective RF output signal ($S_{o1}$), $L_5$ denotes an inductance of the inductor ($TL_{5,1}$), $C_{ds1}$ denotes a parasitic capacitance provided between the first and second terminals of the transistor ($M_{1,1}$), and $R_{ds1}$ denotes a parasitic resistance provided between the first and second terminals of the transistor ($M_{1,1}$). It should be noted that: (a) $Z_{out}$ may be ignored, so Equation 1 may be simplified to the following equation:

$$G_{o1} \approx -g_{m1} \cdot \left[R_{ds1} // \frac{1}{sC_{ds1}} // s\left(\frac{L'_3 \cdot L_4}{L'_3 + L_4} + L_5\right)\right]; \quad \text{Equation 2}$$

and (b) $C_{ds1}$, $L_3'$, $L_4$ and $L_5$ are designed such that $1/\{2\pi\cdot\sqrt{[(L_3'\cdot L_4)/(L_3'+L_4)+L_5]\cdot C_{ds1}}\}$ substantially equals an operation frequency of the RF power amplifier, so Equation 2 may be simplified to the following equation:

$$G_{o1} \approx -g_{m1} \cdot R_{ds1}.\qquad\text{Equation 3}$$

In the depicted example, a closed-loop gain ($G_{f1}$) provided by the positive feedback loop can be expressed by the following equation:

$$G_{f1} = \frac{V_{SB,1}}{V_{SA1,1}}\bigg|_{closed} \qquad\text{Equation 4}$$
$$= G_{o1} + G_{o1}\cdot(G_{o1}\cdot K) + G_{o1}\cdot(G_{o1}\cdot K)^2 + \ldots$$
$$= \frac{G_{o1}}{1 - G_{o1}\cdot K}$$
$$\approx \frac{-g_{m1}\cdot R_{ds1}}{1 + g_{m1}\cdot R_{ds1}\cdot K},$$

where K denotes a feedback factor provided by the positive feedback loop. The feedback factor (K) is mainly associated with a capacitance of the capacitor ($C_{2,1}$) and the inductances of the inductors ($TL_{3,1}$, $TL_{5,1}$), and is also associated with dimensions of the transistor ($M_{1,1}$) respective inductances of the inductors ($TL_{1,1}$, $TL_{2,1}$, $TL_{4,1}$) and the input impedance seen into the second amplifying stage $1_2$. The loop gain provided by the positive feedback loop equals $G_{o1}\cdot K$. It is known from Equation 4 that, since the loop gain is greater than zero and less than one (i.e., $0 < G_{o1}\cdot K < 1$), the closed-loop gain ($G_{f1}$) can be boosted to a finite value that is greater than the open-loop gain ($G_{o1}$) (i.e., $G_{f1} > G_{o1}$).

In the depicted example, a voltage gain ($G_1$) provided by the first amplifying stage $1_1$ can be expressed as the following equation:

$$G_1 = \frac{V_{So1}}{V_{RFin}} = \frac{V_{So1}}{V_{SB,1}} \cdot \frac{V_{SB,1}}{V_{SA1,1}}\bigg|_{closed} \cdot \frac{V_{SA1,1}}{V_{RFin}} = \qquad\text{Equation 5}$$
$$\frac{V_{So1}}{V_{SB,1}} \cdot G_{f1} \cdot \frac{V_{SA1,1}}{V_{RFin}},$$

where $V_{RFin}$ denotes a voltage amplitude of the respective RF input signal ($RF_{in}$). It is known from Equation 5 that a greater closed-loop gain ($G_{f1}$) leads to a greater voltage gain ($G_1$).

In the depicted example, each of the inductors ($TL_{3,1}$, $TL_{5,1}$) is designed to have a characteristic impedance of $50\Omega$, which corresponds to having a width of 7 µm in a case of 90 nm complementary metal oxide semiconductor (CMOS) process, so as to minimize a sum of a transmission loss and a reflection loss. Moreover, the open-loop gain ($G_{o1}$) and the feedback factor (K) are designed to be $-1.4$ and $-0.364$, respectively. That is to say, the loop gain is 0.51 (i.e., $(-1.4)\times(-0.364)$), the closed-loop gain ($G_{f1}$) is $-2.86$, 36.4% of the voltage amplitude of the RF inverted signal ($S_{B,1}$) is fed back to the first RF to-be-amplified signal ($S_{A1,1}$), and 63.6% of the voltage amplitude of the RF inverted signal ($S_{B,1}$) contributes to the transmission and reflection losses. Therefore, by virtue of the feedback module $12_1$ that cooperates with the first amplifying module $11_1$ to form the positive feedback loop which has the loop gain less than one, a power gain provided by the first amplifying stage $1_1$ is increased by 9.1 dB (i.e., $(20\times\log|-2.86|)$ dB $- (20\times\log|-1.4|)$ dB).

Figure 4:
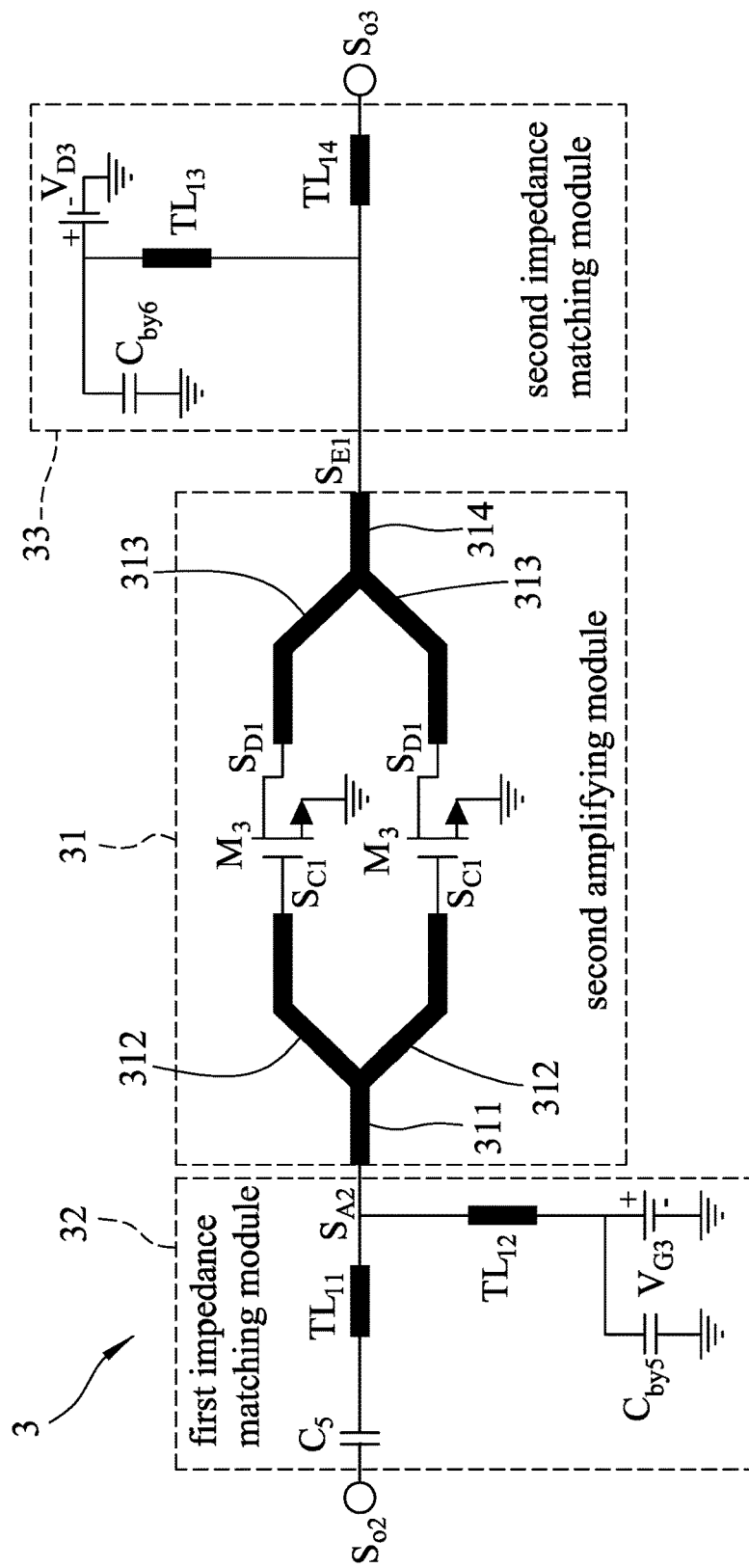
FIG. 4 is a circuit diagram illustrating a third amplifying stage of the first embodiment.

Referring to FIGS. 1 and 4, the depicted $(M+1)^{th}$ (i.e., the third) amplifying stage 3 is a two-way amplifying stage, and includes a first impedance matching module 32, a second amplifying module 31 and a second impedance matching module 33. The first impedance matching module 32 is coupled to the $M^{th}$ (i.e., the second) amplifying stage $1_2$ for receiving the respective RF input signal ($S_{o2}$) therefrom, provides a second RF to-be-amplified signal ($S_{A2}$) based on the respective RF input signal ($S_{o2}$), and determines an input impedance seen into the third amplifying stage 3. The second amplifying module 31 is coupled to the first impedance matching module 32 for receiving the second RF to-be-amplified signal ($S_{A2}$) therefrom. The second amplifying module 31 divides the second RF to-be-amplified signal ($S_{A2}$) into two first RF divided signals ($S_{C1}$), performs power amplification on each first RF divided signal ($S_{C1}$) to generate a respective first RF amplified signal ($S_{D1}$), and combines the first RF amplified signals ($S_{D1}$) into a first RF combined signal ($S_{E1}$). The second impedance matching module 33 is coupled to the second amplifying module 31 for receiving the first RF combined signal ($S_{E1}$) therefrom, provides the respective RF output signal ($S_{o3}$) based on the first RF combined signal ($S_{E1}$), and determines an output impedance seen into the third amplifying stage 3.

In the depicted example, the first impedance matching module 32 is configured such that the input impedance seen into the $(M+1)^{th}$ (i.e., the third) amplifying stage 3 matches an output impedance seen into the $M^{th}$ (i.e., the second) amplifying stage $1_2$.

In the depicted example, the first impedance matching module 31 includes a capacitor ($C_5$), two inductors ($TL_{11}$, $TL_{12}$) and a bypass capacitor ($C_{by5}$). The capacitor ($C_5$) has a first terminal that receives the respective RF input signal ($S_{o2}$), and a second terminal. The inductor ($TL_{11}$) has a first terminal that is coupled to the second terminal of the capacitor ($C_5$), and a second terminal that provides the second RF to-be-amplified signal ($S_{A2}$). The inductor ($TL_{12}$) has a first terminal that is coupled to the second terminal of the inductor ($TL_{11}$), and a second terminal that is used to receive a DC supply voltage ($V_{G3}$). The bypass capacitor ($C_{by5}$) is coupled between the second terminal of the inductor ($TL_{12}$) and ground, and has a substantially zero impedance when the RF power amplifier operates in the predetermined frequency band, such that the second terminal of the inductor ($TL_{12}$) is substantially grounded when the RF power amplifier operates in the predetermined frequency band.

In the depicted example, the second amplifying module 31 includes a first microstrip 311, two second microstrips 312, two transistors ($M_3$), two third microstrips 313 and a fourth microstrip 314. The first microstrip 311 has a first terminal that is coupled to the second terminal of the inductor ($TL_{11}$) for receiving the second RF to-be-amplified signal ($S_{A2}$) therefrom, and a second terminal. Each second microstrip 312 has a first terminal that is coupled to the second terminal of the first microstrip 311, and a second terminal that provides a respective first RF divided signal ($S_{C1}$). Each transistor ($M_3$) (e.g., an nMOSFET) has a first terminal (e.g., a drain terminal) that provides a respective first RF amplified signal ($S_{D1}$), a second terminal (e.g., a source terminal) that is grounded, and a control terminal (e.g., a gate terminal) that is coupled to the second terminal of a respective second microstrip 312 for receiving a respective first RF divided signal ($S_{C1}$) therefrom. Each third microstrip 313 has a first terminal that is coupled to the first terminal of a respective transistor ($M_3$) for receiving a respective first RF amplified signal ($S_{D1}$) therefrom, and a second terminal. The fourth microstrip 314 has a first terminal that is coupled to the second terminals of the third micro strips 313, and a second terminal that provides the first RF combined signal ($S_{E1}$).

In the depicted example, the second impedance matching module 33 includes two inductors ($TL_{13}$, $TL_{14}$) and a bypass capacitor ($C_{by6}$). The inductor ($TL_{14}$) has a first terminal that is coupled to the second terminal of the fourth microstrip 314 for receiving the first RF combined signal ($S_{E1}$) therefrom, and a second terminal that provides the respective RF output signal ($S_{o3}$). The inductor ($TL_{13}$) has a first terminal that is coupled to the first terminal of the inductor ($TL_{14}$), and a second terminal that is used to receive a DC supply voltage ($V_{D3}$). The bypass capacitor ($C_{by6}$) is coupled between the second terminal of the inductor ($TL_{13}$) and ground, and has a substantially zero impedance when the RF power amplifier operates in the predetermined frequency band, such that the second terminal of the inductor ($TL_{13}$) is substantially grounded when the RF power amplifier operates in the predetermined frequency band.

In the depicted example, each inductor ($TL_{11}$-$TL_{14}$) is a transmission line inductor, and may be implemented using a microstrip.

In the depicted example, a voltage gain ($G_3$) provided by the second amplifying module 31 can be expressed by the following equation:

$$G_3 = \frac{V_{SD1}}{V_{SC1}} = -g_{m3} \cdot \left[ (R_{L3} + sL_{L3}) // \frac{1}{sC_{ds3}} // R_{ds3} \right], \quad \text{Equation 6}$$

where $V_{SD1}$ denotes a voltage amplitude of each first RF amplified signal ($S_{D1}$), $V_{SC1}$ denotes a voltage amplitude of each first RF divided signal ($S_{C1}$), $g_{m3}$ denotes a transconductance of each transistor ($M_3$), $R_{L3}$ and $L_{L3}$ respectively denote a real part and an imaginary part of an impedance seen into each third microstrip 313 from the first terminal thereof, $C_{ds3}$ denotes a parasitic capacitance provided between the first and second terminals of each transistor ($M_3$), and $R_{ds3}$ denotes a parasitic resistance provided between the first and second terminals of each transistor ($M_3$). The impedance seen into each third microstrip 313 from the first terminal thereof is associated with an impedance of each third microstrip 313, an impedance of the fourth microstrip 314, and an impedance seen into the second impedance matching module 33 from the first terminal of the inductor ($TL_{14}$).

It should be noted that, by two-way amplification, output power of the third amplifying stage 3 is two times that of each transistor ($M_3$), which advantageously increases both output power and saturated output power of the RF power amplifier. Moreover, by design of an impedance seen into the first impedance matching module 32 from the second terminal of the inductor ($TL_{11}$) and the impedance seen into the second impedance matching module 33 from the first terminal of the inductor ($TL_{14}$) an equivalent electrical length of a combination of the first and second microstrips 311, 312 and an equivalent electrical length of a combination of the third and fourth microstrips 313, 314 can be significantly reduced, which advantageously reduces the space occupied by the RF power amplifier and the manufacturing costs of the RF power amplifier.

Figure 5:
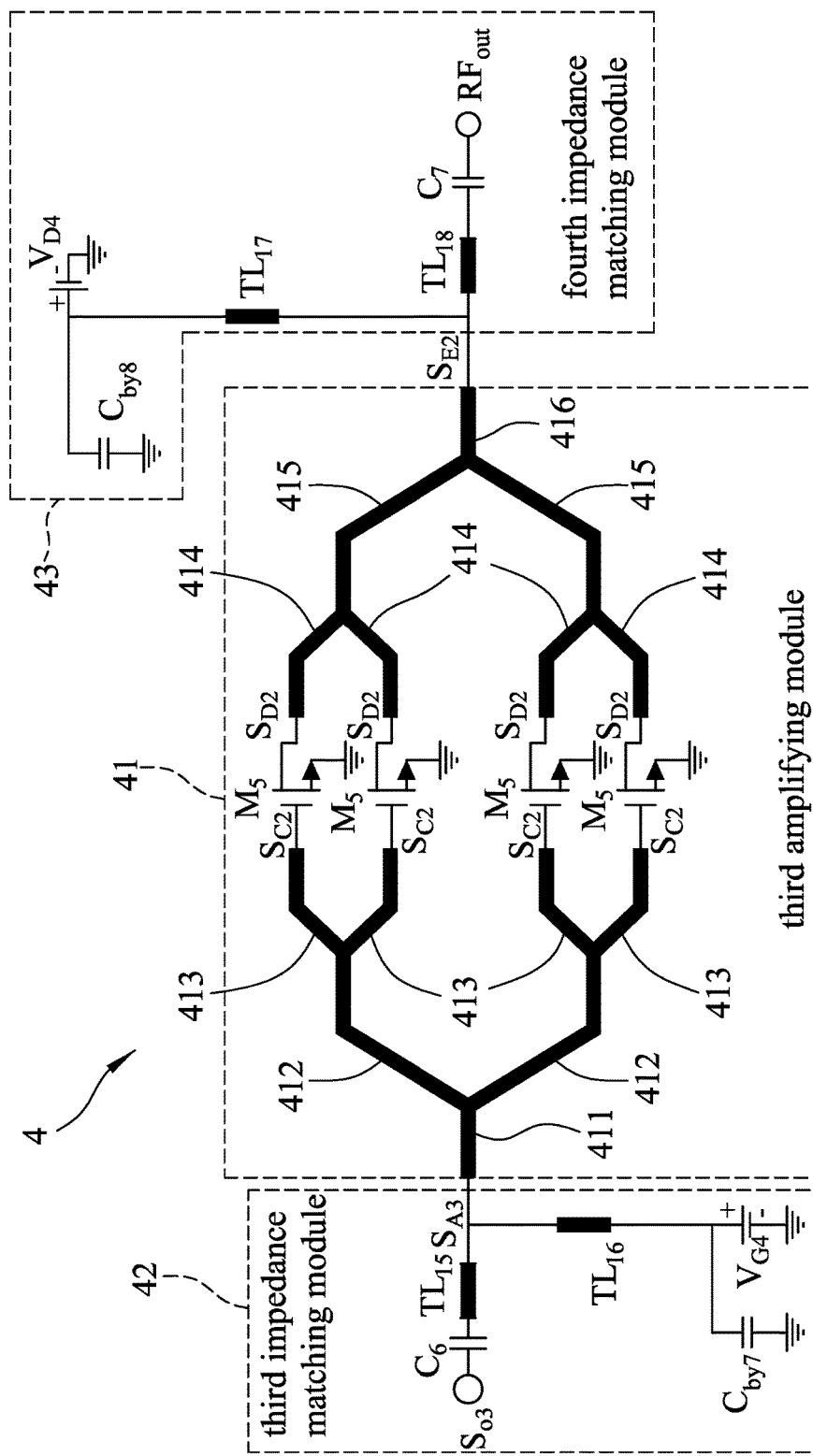
FIG. 5 is a circuit diagram illustrating a fourth amplifying stage of the first embodiment.

Referring to FIGS. 1 and 5, the depicted (M+2)$^{th}$ (i.e., the fourth) amplifying stage 4 is a four-way amplifying stage, and includes a third impedance matching module 42, a third amplifying module 41 and a fourth impedance matching module 43. The third impedance matching module 42 is coupled to the (M+1)$^{th}$ (i.e., the third) amplifying stage 3 for receiving the respective RF input signal ($S_{o3}$) therefrom, provides a third RF to-be-amplified signal ($S_{A3}$) based on the respective RF input signal ($S_{o3}$), and determines an input impedance seen into the fourth amplifying stage 4. The third amplifying module 41 is coupled to the third impedance matching module 42 for receiving the third RF to-be-amplified signal ($S_{A3}$) therefrom. The third amplifying module 41 divides the third RF to-be-amplified signal ($S_{A3}$) into four second RF divided signals ($S_{C2}$), performs power amplification on each second RF divided signal ($S_{C2}$) to generate a respective second RF amplified signal ($S_{D2}$), and combines the second RF amplified signals ($S_{D2}$) into a second RF combined signal ($S_{E2}$). The fourth impedance matching module 43 is coupled to the third amplifying module 41 for receiving the second RF combined signal ($S_{E2}$) therefrom, and is coupled further to the post-stage circuit 6. The fourth impedance matching module 43 provides, based on the second RF combined signal ($S_{E2}$), the respective RF output signal ($RF_{out}$) for the post-stage circuit 6, and determines an output impedance seen into the fourth amplifying stage 4.

In the depicted example, the second and third impedance matching modules 33, 42 are configured such that the input impedance seen into the (M+2)$^{th}$ (i.e., the fourth) amplifying stage 4 matches the output impedance seen into the (M+1)$^{th}$ (i.e., the third) amplifying stage 3. Moreover, the fourth impedance matching module 43 is configured such that the output impedance seen into the (M+2)$^{th}$ (i.e., the fourth) amplifying stage 4 matches an input impedance (e.g., 50Ω) seen into the post-stage circuit 6.

In the depicted example, the third impedance matching module 42 includes a capacitor ($C_6$), two inductors ($TL_{15}$, $TL_{16}$) and a bypass capacitor ($C_{by7}$). The capacitor ($C_6$) has a first terminal that receives the respective RF input signal ($S_{o3}$), and a second terminal. The inductor ($TL_{15}$) has a first terminal that is coupled to the second terminal of the capacitor ($C_6$), and a second terminal that provides the third RF to-be-amplified signal ($S_{A3}$). The inductor ($TL_{16}$) has a first terminal that is coupled to the second terminal of the inductor ($TL_{15}$), and a second terminal that is used to receive a DC supply voltage ($V_{G4}$). The bypass capacitor ($C_{by7}$) is coupled between the second terminal of the inductor ($TL_{16}$) and ground, and has a substantially zero impedance when the RF power amplifier operates in the predetermined frequency band, such that the second terminal of the inductor ($TL_{16}$) is substantially grounded when the RF power amplifier operates in the predetermined frequency band.

In the depicted example, the third amplifying module 41 includes a fifth microstrip 411, two sixth microstrips 412, two pairs of seventh microstrips 413, four transistors ($M_5$), two pairs of eighth microstrips 414, two ninth microstrips 415 and a tenth microstrip 416. The fifth microstrip 411 has a first terminal that is coupled to the second terminal of the inductor ($TL_{15}$) for receiving the third RF to-be-amplified signal ($S_{A3}$) therefrom, and a second terminal. Each sixth microstrip 412 has a first terminal that is coupled to the second terminal of the fifth microstrip 411, and a second terminal. Each pair of the seventh microstrips 413 corresponds to a respective sixth microstrip 412. Each seventh microstrip 413 has a first terminal that is coupled to the second terminal of the corresponding sixth microstrip 412, and a second terminal that provides a respective second RF divided signal ($S_{C2}$). Each transistor ($M_5$) (e.g., an nMOSFET) has a first terminal (e.g., a drain terminal) that provides a respective second RF amplified signal ($S_{D2}$), a second terminal (e.g., a source terminal) that is grounded, and a control terminal (e.g., a gate terminal) that is coupled to the second terminal of a respective seventh microstrip 413 for receiving a respective second RF divided signal ($S_{C2}$) therefrom. Each eighth microstrip 414 has a first terminal that is coupled to the first terminal of a respective transistor ($M_5$) for receiving a respective second RF amplified signal ($S_{D2}$) therefrom, and a second terminal. Each ninth micros trip 415 has a first terminal that is coupled to the second terminals of a respective pair of the eighth microstrips 414, and a second terminal. The tenth microstrip 416 has a first terminal that is coupled to the second terminals of the ninth microstrips 415, and a second terminal that provides the second RF combined signal ($S_{E2}$).

In the depicted example, the fourth impedance matching module 43 includes two inductors ($TL_{17}$, $TL_{18}$), a capacitor ($C_7$) and a bypass capacitor ($C_{by8}$). The inductor ($TL_{18}$) has a first terminal that is coupled to the second terminal of the tenth microstrip 416 for receiving the second RF combined signal ($S_{E2}$) therefrom, and a second terminal. The capacitor ($C_7$) has a first terminal that is coupled to the second terminal of the inductor ($TL_{18}$), and a second terminal that provides the respective RF output signal ($RF_{out}$). The inductor ($TL_{17}$) has a first terminal that is coupled to the first terminal of the inductor ($TL_{18}$), and a second terminal that is used to receive a DC supply voltage ($V_{D4}$). The bypass capacitor ($C_{by7}$) is coupled between the second terminal of the inductor ($TL_{17}$) and ground, and has a substantially zero impedance when the RF power amplifier operates in the predetermined frequency band, such that the second terminal of the inductor ($TL_{17}$) is substantially grounded when the RF power amplifier operates in the predetermined frequency band.

In the depicted example, each inductor ($TL_{15}$-$TL_{18}$) is a transmission line inductor, and may be implemented using a microstrip.

In the depicted example, a voltage gain ($G_4$) provided by the third amplifying module 41 can be expressed by the following equation:

$$G_4 = \frac{V_{SD2}}{V_{SC2}} = -g_{m5} \cdot \left[ (R_{LA} + sL_{LA}) // \frac{1}{sC_{ds5}} // R_{ds5} \right], \quad \text{Equation 7}$$

where $V_{SD2}$ denotes a voltage amplitude of each second RF amplified signal ($S_{D2}$), $V_{SC2}$ denotes a voltage amplitude of each second RF divided signal ($S_{o2}$), $g_{m5}$ denotes a transconductance of each transistor ($M_5$), $R_{L4}$ and $L_{L4}$ respectively denote a real part and an imaginary part of an impedance seen into each eighth microstrip 414 from the first terminal thereof, $C_{ds5}$ denotes a parasitic capacitance provided between the first and second terminals of each transistor ($M_5$), and $R_{ds5}$ denotes a parasitic resistance provided between the first and second terminals of each transistor ($M_5$). The impedance seen into each eighth microstrip 414 from the first terminal thereof is associated with an impedance of each eighth microstrip 414, an impedance of each ninth microstrip 415, an impedance of the tenth microstrip 416, and an impedance seen into the fourth impedance matching module 43 from the first terminal of the inductor ($TL_{18}$).

It should be noted that, by four-way amplification, output power of the fourth amplifying stage 4 is four times that of each transistor ($M_5$), which advantageously increases both the output power and the saturated output power of the RF power amplifier. Moreover, by design of an impedance seen into the third impedance matching module 42 from the second terminal of the inductor ($TL_{15}$) and the impedance seen into the fourth impedance matching module 43 from the first terminal of the inductor ($TL_{18}$), an equivalent electrical length of a combination of the fifth to seventh microstrips 411-413 and an equivalent electrical length of a combination of the eighth to tenth microstrips 414-416 can be significantly reduced, which advantageously reduces the space occupied by the RF power amplifier and the manufacturing costs of the RF power amplifier.

Referring to FIG. 1, in the depicted example, power added efficiency (PAE) of the RF power amplifier can be expressed by the following equation:

$$PAE = \frac{P_{out} - P_{in}}{P_{DC}} = \frac{P_{out} \cdot \left(1 - \frac{1}{G}\right)}{P_{DC}}, \quad \text{Equation 8}$$

where $P_{out}$ denotes the output power of the RF power amplifier, $P_{in}$ denotes input power of the RF power amplifier, $P_{DC}$ denotes total DC power required by the RF power amplifier, and G denotes a power gain provided by the RF power amplifier. The power gain (G) is proportional to the voltage gains ($G_1$, $G_2$) provided by the first and second amplifying stages $1_1$, $1_2$. It is known from Equation 8 that, a greater voltage gain ($G_1$, $G_2$) leads to a greater PAE. It should be noted that the voltage gains ($G_1$, $G_2$) are designed such that the power gain (G) is far greater than one, so Equation 8 can be simplified to the following equation:

$$PAE \approx \frac{P_{out}}{P_{DC}}. \quad \text{Equation 9}$$

It is known from Equation 9 that, for a predetermined output power ($P_{out}$) value, the higher the PAE, the lower the total DC power ($P_{DC}$), that is, the greater the energy saving.

Figure 6:
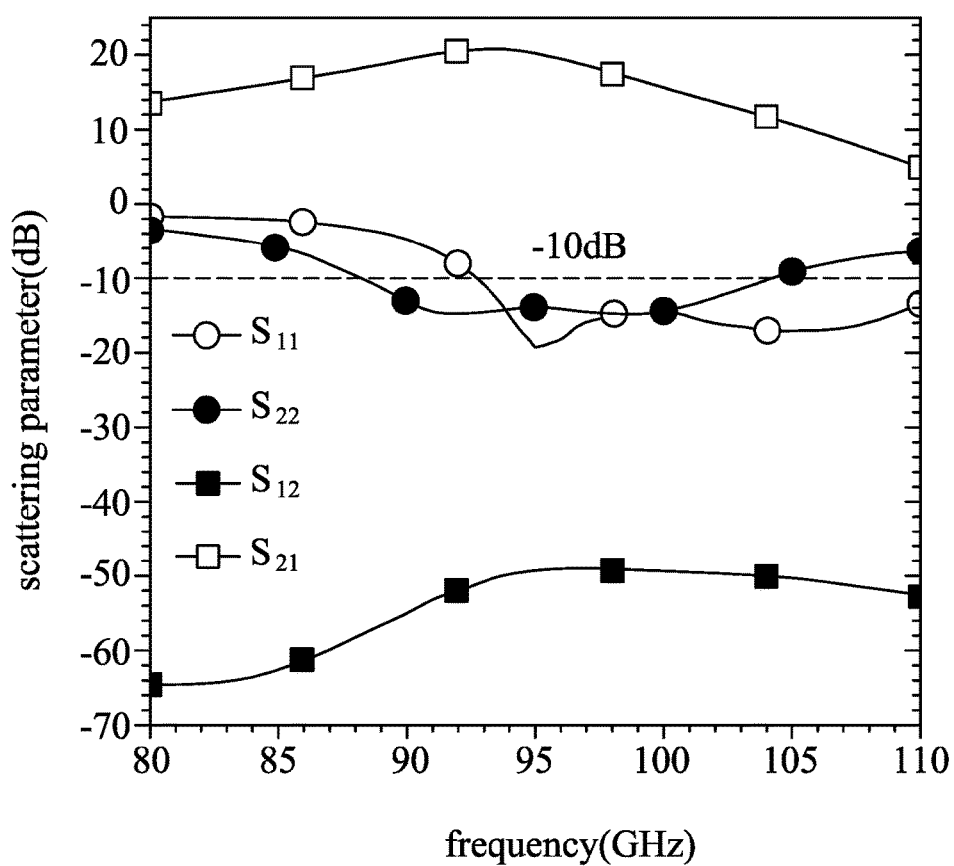
FIG. 6 is a plot illustrating various scattering parameters versus frequency characteristics of the first embodiment.

FIG. 6 illustrates simulated scattering parameters ($S_{11}$, $S_{12}$, $S_{21}$, $S_{22}$) of the RF power amplifier when the RF power amplifier operates within 80 GHz to 110 GHz. It is known from the scattering parameter ($S_{21}$) that the RF power amplifier has a power gain of 20.4 dB when operating at 94 GHz, and has a 3 dB bandwidth of 10 GHz (from 88 GHz to 98 GHz).

Figure 7:
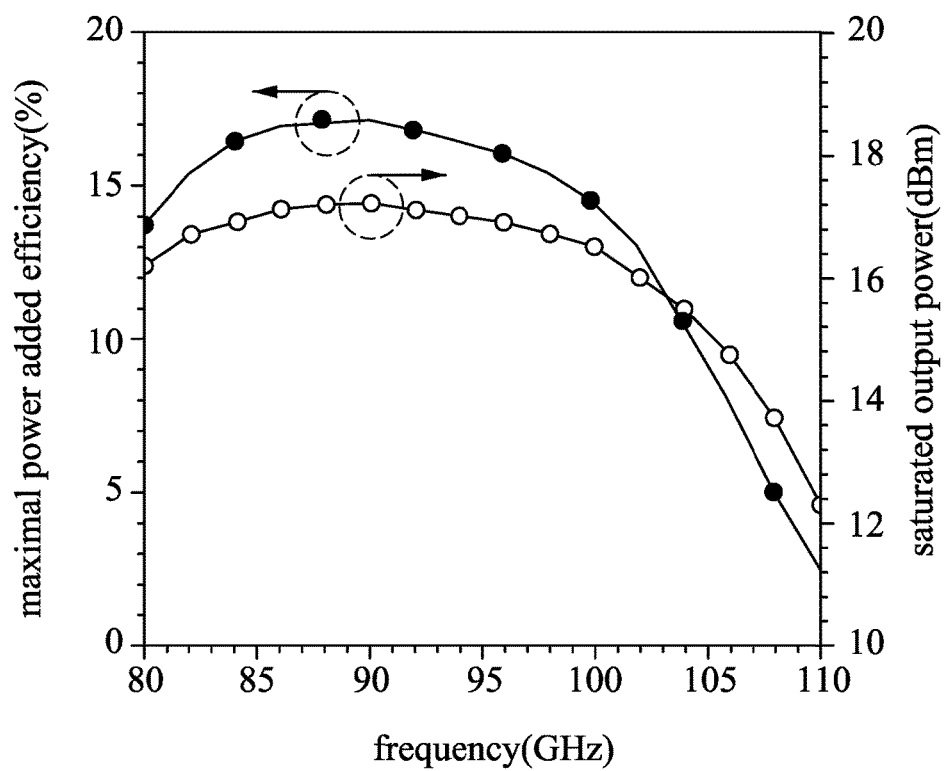
FIG. 7 is a plot illustrating maximal power added efficiency and saturated output power versus frequency characteristics of the first embodiment.

FIG. 7 illustrates simulated maximal power added efficiency and simulated saturated output power of the RF power amplifier when the RF power amplifier operates within 80 GHz to 110 GHz. It is known from FIG. 7 that, when the RF power amplifier operates within 88 GHz to 98 GHz, the maximal power added efficiency thereof is within a range of 15.4% to 17.1% and the saturated output power thereof is within a range of 16.7 dBm to 17.2 dBm.

Figure 8:
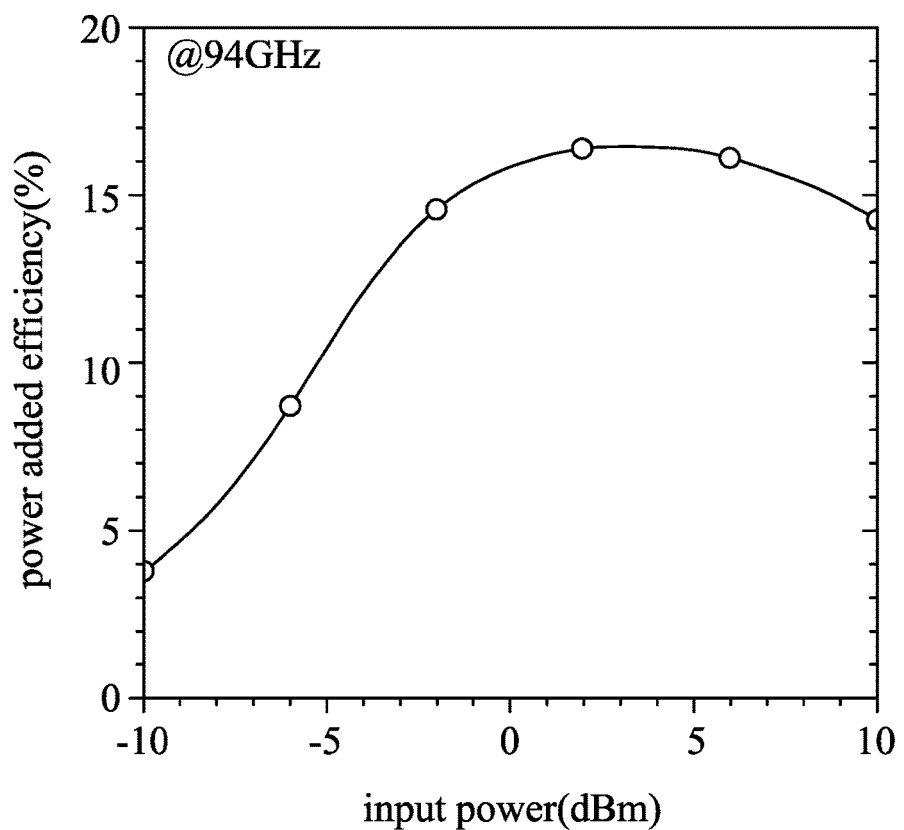
FIG. 8 is a plot illustrating power added efficiency versus input power characteristics of the first embodiment operating at 94 GHz.

FIG. 8 illustrates simulated power added efficiency versus input power characteristics of the RF power amplifier when the RF power amplifier operates at 94 GHz. It is known from FIG. 8 that, when the RF power amplifier operates at 94 GHz, the maximal power added efficiency thereof is 16.4%.

Figure 9:
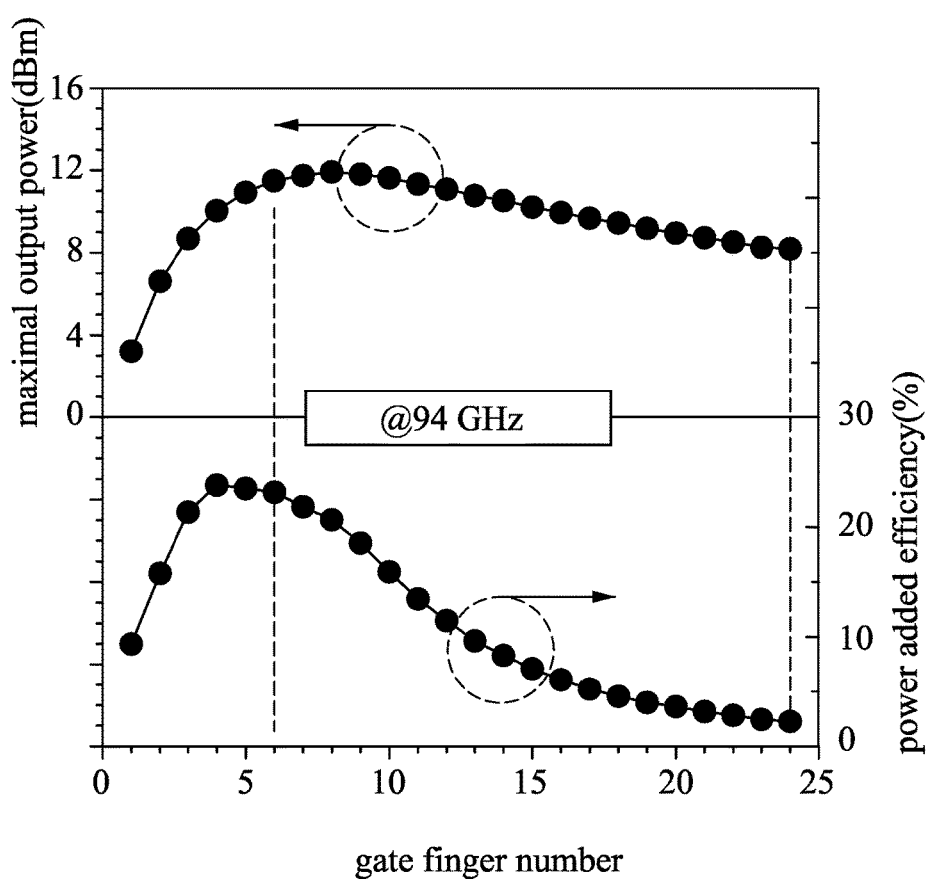
FIG. 9 is a plot illustrating maximal output power and power added efficiency versus gate finger number characteristics of a transistor of the fourth amplifying stage of the first embodiment operating at 94 GHz.

FIG. 9 illustrates simulated maximal output power and simulated power added efficiency versus gate finger number characteristics of each transistor ($M_5$) (see FIG. 5) when the RF power amplifier operates at 94 GHz and when each transistor ($M_5$) has a gate width of 2 μm. It is known from FIG. 9 that, when the gate finger number of each transistor ($M_5$) is six, the maximal output power and the power added efficiency of each transistor ($M_5$) are respectively 11.5 dBm and 23.1%. Therefore, the maximal output power and power added efficiency of the third amplifying module 41 (see FIG. 5) are respectively 17.5 dBm (i.e., four times the maximal output power of each transistor ($M_5$)) and 23.1%. It should be noted that, under a circumstance where the third amplifying module only includes a transistor with a gate finger number of twenty-four, the maximal output power and power added efficiency of the third amplifying module would respectively be 8.1 dBm and 2.2%, which are relatively low as compared to those of the third amplifying module 41 of the depicted example.

In view of the above, the RF power amplifier of this embodiment has the following advantages:

1. By virtue of the first and second amplifying stages $1_1$, $1_2$ each with a positive feedback loop that provides a loop gain which is less than one, the power added efficiency of the RF power amplifier can be relatively high.

2. By virtue of the third amplifying stage 3 that performs two-way power amplification, and by virtue of the fourth amplifying stage 4 that performs four-way power amplification, the output power of the RF power amplifier can be relatively high.

3. The RF power amplifier can be implemented in CMOS technologies, thereby having relatively low manufacturing costs.

4. By virtue of the first to fourth impedance matching modules 32, 33, 42, 43, the space occupied by the RF power amplifier and the manufacturing costs of the RF power amplifier can be reduced.

Figure 10:
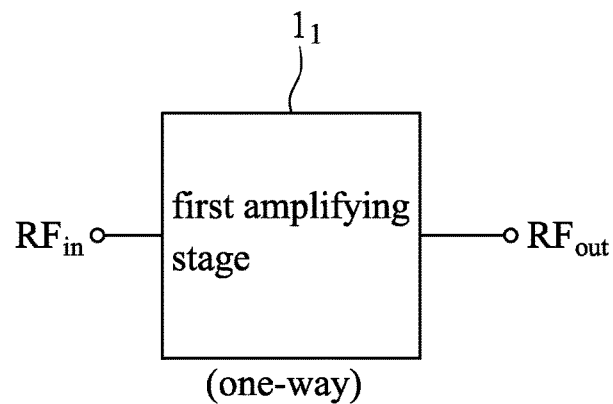
FIG. 10 is a block diagram illustrating a second embodiment of the RF power amplifier according to the disclosure.

Referring to FIG. 10, a second embodiment of the RF power amplifier according to the disclosure is a modification of the first embodiment, and differs from the first embodiment in that N=M=1.

Figure 11:
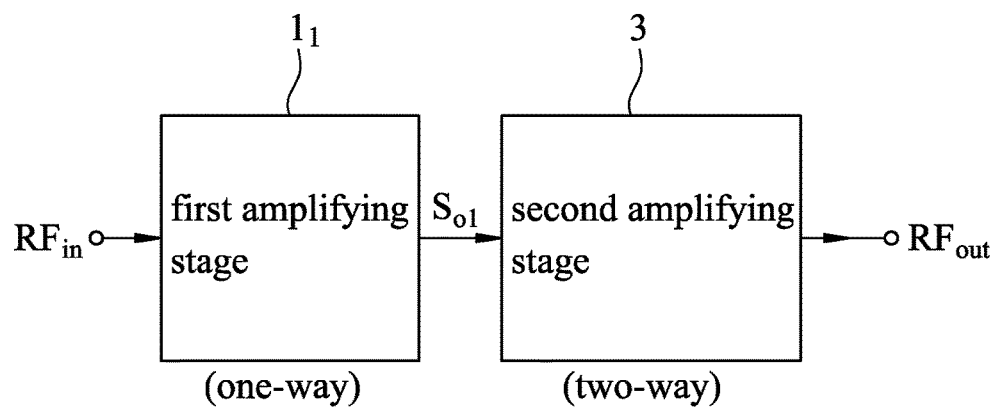
FIG. 11 is a block diagram illustrating a third embodiment of the RF power amplifier according to the disclosure.

Referring to FIG. 11, a third embodiment of the RF power amplifier according to the disclosure is a modification of the first embodiment, and differs from the first embodiment in that N=2 and that M=N−1=1.

Figure 12:
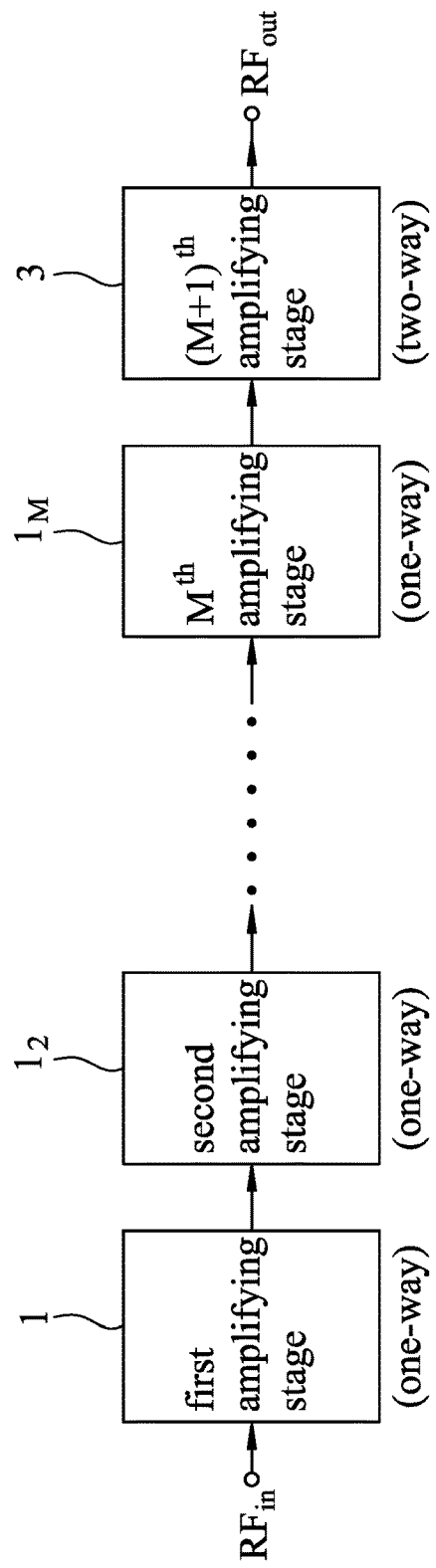
FIG. 12 is a block diagram illustrating a fourth embodiment of the RF power amplifier according to the disclosure.

Referring to FIG. 12, a third embodiment of the RF power amplifier according to the disclosure is a modification of the first embodiment, and differs from the first embodiment in that N≥4 and that M=N−1≥3.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A radio frequency (RF) power amplifier comprising:
a number (N) of amplifying stages, each receiving a respective RF input signal and outputting a respective RF output signal, where N≥1;
when N≥2, said amplifying stages being cascaded, and the respective RF output signal outputted by an $n^{th}$ one of said amplifying stages serving as the respective RF input signal received by an $(n+1)^{th}$ one of said amplifying stages, where 1≤n≤(N−1);
each of first to $M^{th}$ ones of said amplifying stages including
a first amplifying module receiving a first RF to-be-amplified signal, and performing power amplification on the first RF to-be-amplified signal to generate the respective RF output signal and an RF inverted signal that is anti-phase with the first RF to-be-amplified signal,
an input module coupled to said first amplifying module, and receiving the respective RF input signal, and
a feedback module coupled to said first amplifying module and said input module, and receiving the respective RF output signal from said first amplifying module, said feedback module cooperating with said input module to provide, based on the respective RF input signal and the respective RF output signal, the first RF to-be-amplified signal for said first amplifying module, said feedback module cooperating with said first amplifying module to form a positive feedback loop that provides a loop gain which is less than one, a portion of the first RF to-be-amplified signal that is contributed by the respective RF output signal being anti-phase with the RF inverted signal,
where 1≤M≤N;
for each of said first to $M^{th}$ ones of said amplifying stages, said first amplifying module including:
a transistor having a first terminal that provides the RF inverted signal, a second terminal that is grounded, and a control terminal that is coupled to said input module and said feedback module for receiving the first RF to-be-amplified signal therefrom;
a first inductor having a first terminal that is coupled to said feedback module and that provides the respective RF output signal, and a second terminal that is coupled to said first terminal of said transistor; and
a second inductor having a first terminal that is used to receive a supply voltage, and a second terminal that is coupled to said first terminal of said first inductor.

2. The RF power amplifier of claim 1, wherein for each of said first to $M^{th}$ ones of said amplifying stages, said feedback module includes:
a capacitor having a first terminal that is coupled to said control terminal of said transistor, and a second terminal; and
a third inductor coupled between said second terminal of said capacitor and said first terminal of said first inductor.

3. The RF power amplifier of claim 2, wherein for each of said first to $M^{th}$ ones of said amplifying stages, each of said first to third inductors is a transmission line inductor with a predetermined electrical length, and a sum of the predetermined electrical lengths of said first and third inductors equals half a wavelength of the respective RF input signal.

4. A radio frequency (RF) power amplifier comprising:
a number (N) of amplifying stages, each receiving a respective RF input signal and outputting a respective RF output signal, where N≥1;
when N≥2, said amplifying stages being cascaded, and the respective RF output signal outputted by an $n^{th}$ one of said amplifying stages serving as the respective RF input signal received by an $(n+1)^{th}$ one of said amplifying stages, where 1≤n≤(N−1);
each of first to $M^{th}$ ones of said amplifying stages including
a first amplifying module receiving a first RF to-be-amplified signal, and performing power amplification on the first RF to-be-amplified signal to generate the respective RF output signal,
an input module coupled to said first amplifying module, and receiving the respective RF input signal, and
a feedback module coupled to said first amplifying module and said input module, and receiving the respective RF output signal from said first amplifying module, said feedback module cooperating with said input module to provide, based on the respective RF input signal and the respective RF output signal, the first RF to-be-amplified signal for said first amplifying module, said feedback module cooperating with said first amplifying module to form a positive feedback loop that provides a loop gain which is less than one,
where 1≤M≤N;
for each of said first to $M^{th}$ ones of said amplifying stages, said input module including:
a capacitor having a first terminal that is used to receive the respective RF input signal, and a second terminal;
a first inductor having a first terminal that is coupled to said second terminal of said capacitor, and a second terminal that is coupled to said first amplifying module and said feedback module and that provides the first RF to-be-amplified signal; and
a second inductor having a first terminal that is coupled to said second terminal of said capacitor, and a second terminal that is used to receive a supply voltage.

5. The RF power amplifier of claim 1, wherein for each of said first to $M^{th}$ ones of said amplifying stages, said input module determines an input impedance seen into said amplifying stage.

6. The RF power amplifier of claim 5, wherein for said first one of said amplifying stages, said input module is used to be coupled to a pre-stage circuit for receiving the respective RF input signal therefrom, and is configured such that the input impedance seen into said amplifying stage matches an output impedance seen into the pre-stage circuit.

7. The RF power amplifier of claim 5, wherein N≥2, 2≤M≤N, and for an $m^{th}$ one of said amplifying stages, said input module is configured such that the input impedance seen into said amplifying stage matches an output impedance seen into an $(m−1)^{th}$ one of said amplifying stages, where 2≤m≤M.

8. A radio frequency (RF) power amplifier comprising:
a number (N) of amplifying stages, each receiving a respective RF input signal and outputting a respective RF output signal, where N≥2;
said amplifying stages being cascaded, and the respective RF output signal outputted by an $n^{th}$ one of said amplifying stages serving as the respective RF input signal received by an $(n+1)^{th}$ one of said amplifying stages, where 1≤n≤(N−1);
each of first to $M^{th}$ ones of said amplifying stages including
a first amplifying module receiving a first RF to-be-amplified signal, and performing power amplification on the first RF to-be-amplified signal to generate the respective RF output signal,
an input module coupled to said first amplifying module, and receiving the respective RF input signal, and
a feedback module coupled to said first amplifying module and said input module, and receiving the respective RF output signal from said first amplifying module, said feedback module cooperating with said input module to provide, based on the respective RF input signal and the respective RF output signal, the first RF to-be-amplified signal for said first amplifying module, said feedback module cooperating with said first amplifying module to form a positive feedback loop that provides a loop gain which is less than one,
where 1≤M≤N−1;
an $(M+1)^{th}$ one of said amplifying stages including:
a first impedance matching module receiving the respective RF input signal, providing a second RF to-be-amplified signal based on the respective RF input signal, and determining an input impedance seen into said amplifying stage;
a second amplifying module coupled to said first impedance matching module for receiving the second RF to-be-amplified signal therefrom, said second amplifying module dividing the second RF to-be-amplified signal into two first RF divided signals, performing power amplification on each of the first RF divided signals to generate a respective first RF amplified signal, and combining the first RF amplified signals into a first RF combined signal; and
a second impedance matching module coupled to said second amplifying module for receiving the first RF combined signal therefrom, providing the respective RF output signal based on the first RF combined signal, and determining an output impedance seen into said amplifying stage.

9. The RF power amplifier of claim 8, wherein said first impedance matching module is configured such that the input impedance seen into said $(M+1)^{th}$ one of said amplifying stages matches an output impedance seen into said $M^{th}$ one of said amplifying stages.

10. The RF power amplifier of claim 8, wherein said first impedance matching module includes:
a capacitor having a first terminal that receives the respective RF input signal, and a second terminal;
a first inductor having a first terminal that is coupled to said second terminal of said capacitor, and a second terminal that is coupled to said second amplifying module and that provides the second RF to-be-amplified signal; and
a second inductor having a first terminal that is coupled to said second terminal of said first inductor, and a second terminal that is used to receive a supply voltage.

11. The RF power amplifier of claim 8, wherein said second amplifying module includes:
a first microstrip having a first terminal that is coupled to said first impedance matching module for receiving the second RF to-be-amplified signal therefrom, and a second terminal;

two second microstrips, each having a first terminal that is coupled to said second terminal of said first microstrip, and a second terminal that provides a respective one of the first RF divided signals;
two transistors, each having a first terminal that provides a respective one of the first RF amplified signals, a second terminal that is grounded, and a control terminal that is coupled to said second terminal of a respective one of said second microstrips for receiving a respective one of the first RF divided signals therefrom;
two third microstrips, each having a first terminal that is coupled to said first terminal of a respective one of said transistors for receiving a respective one of the first RF amplified signals therefrom, and a second terminal; and
a fourth microstrip having a first terminal that is coupled to said second terminals of said third microstrips, and a second terminal that is coupled to said second impedance matching module and that provides the first RF combined signal.

12. The RF power amplifier of claim 8, wherein said second impedance matching module includes:
a first inductor having a first terminal that is coupled to said second amplifying module for receiving the first RF combined signal therefrom, and a second terminal that provides the respective RF output signal; and
a second inductor having a first terminal that is coupled to said first terminal of said first inductor, and a second terminal that is used to receive a supply voltage.

13. The RF power amplifier of claim 8, wherein $N \geq 3$, $M=N-2$, and an $(M+2)^{th}$ one of said amplifying stages includes:
a third impedance matching module receiving the respective RF input signal, providing a third RF to-be-amplified signal based on the respective RF input signal, and determining an input impedance seen into said amplifying stage;
a third amplifying module coupled to said third impedance matching module for receiving the third RF to-be-amplified signal therefrom, said third amplifying module dividing the third RF to-be-amplified signal into four second RF divided signals, performing power amplification on each of the second RF divided signals to generate a respective second RF amplified signal, and combining the second RF amplified signals into a second RF combined signal; and
a fourth impedance matching module coupled to said third amplifying module for receiving the second RF combined signal therefrom, providing the respective RF output signal based on the second RF combined signal, and determining an output impedance seen into said amplifying stage.

14. The RF power amplifier of claim 13, wherein said second and third impedance matching modules are configured such that the input impedance seen into said $(M+2)^{th}$ one of said amplifying stages matches the output impedance seen into said $(M+1)^{th}$ one of said amplifying stages.

15. The RF power amplifier of claim 13, wherein said fourth impedance matching module is used to be coupled to a post-stage circuit for providing the respective RF output signal thereto, and is configured such that the output impedance seen into said $(M+2)^{th}$ one of said amplifying stages matches an input impedance seen into the post-stage circuit.

16. The RF power amplifier of claim 13, wherein said third impedance matching module includes:
a capacitor having a first terminal that receives the respective RF input signal, and a second terminal;
a first inductor having a first terminal that is coupled to said second terminal of said capacitor, and a second terminal that is coupled to said third amplifying module and that provides the third RF to-be-amplified signal; and
a second inductor having a first terminal that is coupled to said second terminal of said first inductor, and a second terminal that is used to receive a supply voltage.

17. The RF power amplifier of claim 13, wherein said third amplifying module includes:
a first microstrip having a first terminal that is coupled to said third impedance matching module for receiving the third RF to-be-amplified signal therefrom, and a second terminal;
two second microstrips, each having a first terminal that is coupled to said second terminal of said first microstrip, and a second terminal;
two pairs of third microstrips, each pair of said third microstrips corresponding to a respective one of said second microstrips, each of said third microstrips having a first terminal that is coupled to said second terminal of said corresponding one of said second microstrips, and a second terminal that provides a respective one of the second RF divided signals;
four transistors, each having a first terminal that provides a respective one of the second RF amplified signals, a second terminal that is grounded, and a control terminal that is coupled to said second terminal of a respective one of said third microstrips for receiving a respective one of the second RF divided signals therefrom;
two pairs of fourth microstrips, each of said fourth microstrips having a first terminal that is coupled to said first terminal of a respective one of said transistors for receiving a respective one of the second RF amplified signals therefrom, and a second terminal;
two fifth microstrips, each having a first terminal that is coupled to said second terminals of a respective pair of said fourth microstrips, and a second terminal; and
a sixth microstrip having a first terminal that is coupled to said second terminals of said fifth microstrips, and a second terminal that is coupled to said fourth impedance matching module and that provides the second RF combined signal.

18. The RF power amplifier of claim 13, wherein said fourth impedance matching module includes:
a first inductor having a first terminal that is coupled to said third amplifying module for receiving the second RF combined signal therefrom, and a second terminal;
a capacitor having a first terminal that is coupled to said second terminal of said first inductor, and a second terminal that provides the respective RF output signal; and
a second inductor having a first terminal that is coupled to said first terminal of said first inductor, and a second terminal that is used to receive a supply voltage.

* * * * *